(12) United States Patent
Saito et al.

(10) Patent No.: US 6,887,084 B2
(45) Date of Patent: May 3, 2005

(54) ELECTRICAL CONNECTION BOX AND METHOD FOR PRODUCING IT

(75) Inventors: Yukitaka Saito, Yokkaichi (JP); Yuuji Saka, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/202,966

(22) Filed: Jul. 24, 2002

(65) Prior Publication Data

US 2003/0022536 A1 Jan. 30, 2003

(30) Foreign Application Priority Data

Jul. 24, 2001 (JP) ........................................ 2001-223622

(51) Int. Cl.[7] .................................................. H01R 9/09
(52) U.S. Cl. ..................................... 439/76.2; 337/290
(58) Field of Search ............................... 439/76.2, 212, 439/34; 361/626, 642, 622; 337/186–190, 290; 174/52.1, 71, 71 B, 70 B (56) References Cited

U.S. PATENT DOCUMENTS 5,795,193 A  * 8/1998  Yang ........................... 439/621
5,886,611 A  * 3/1999  Schaller et al. ............. 361/642
5,928,004 A  * 7/1999  Sumida et al. ............. 439/76.2
6,322,376 B1 * 11/2001 Jetton ......................... 439/76.2
6,431,880 B1 * 8/2002  Davis et al. ................ 439/76.2

FOREIGN PATENT DOCUMENTS

| EP | 1 075 012 | 2/2001 |
| EP | 0 939 967 | 1/2002 |
| JP | 57-42183 | 9/1982 |
| JP | 4-3381 | 2/1992 |

* cited by examiner

Primary Examiner—Renee Luebke
Assistant Examiner—Felix O. Figueroa
(74) Attorney, Agent, or Firm—Gerald E. Hespos; Anthony J. Casella (57) ABSTRACT

A busbar is arranged along a clearance, which is a dead space between a plurality of relay mounting portions and a fuse mounting portion in a block main body. The busbar is provided with narrow fusible links and tabs for connection with relays and fuses. The tabs are formed by bending portions of the busbar at positions downstream of the fusible links and are inserted through terminal holes in the relay mounting portions and the fuse mounting portion. The fusible links are set to be fusible at 30 amperes or higher, and a power supply is connected with the relays via the fusible link portions.

12 Claims, 6 Drawing Sheets

ELECTRICAL CONNECTION BOX AND
METHOD FOR PRODUCING IT

BACKGROUND OF THE INVENTION

1. Field of the Invention

The invention relates to an electrical connection box such as a relay block to be installed in an automotive vehicle and to a method for producing such electrical connection box.

2. Description of the Related Art

Figure 6:
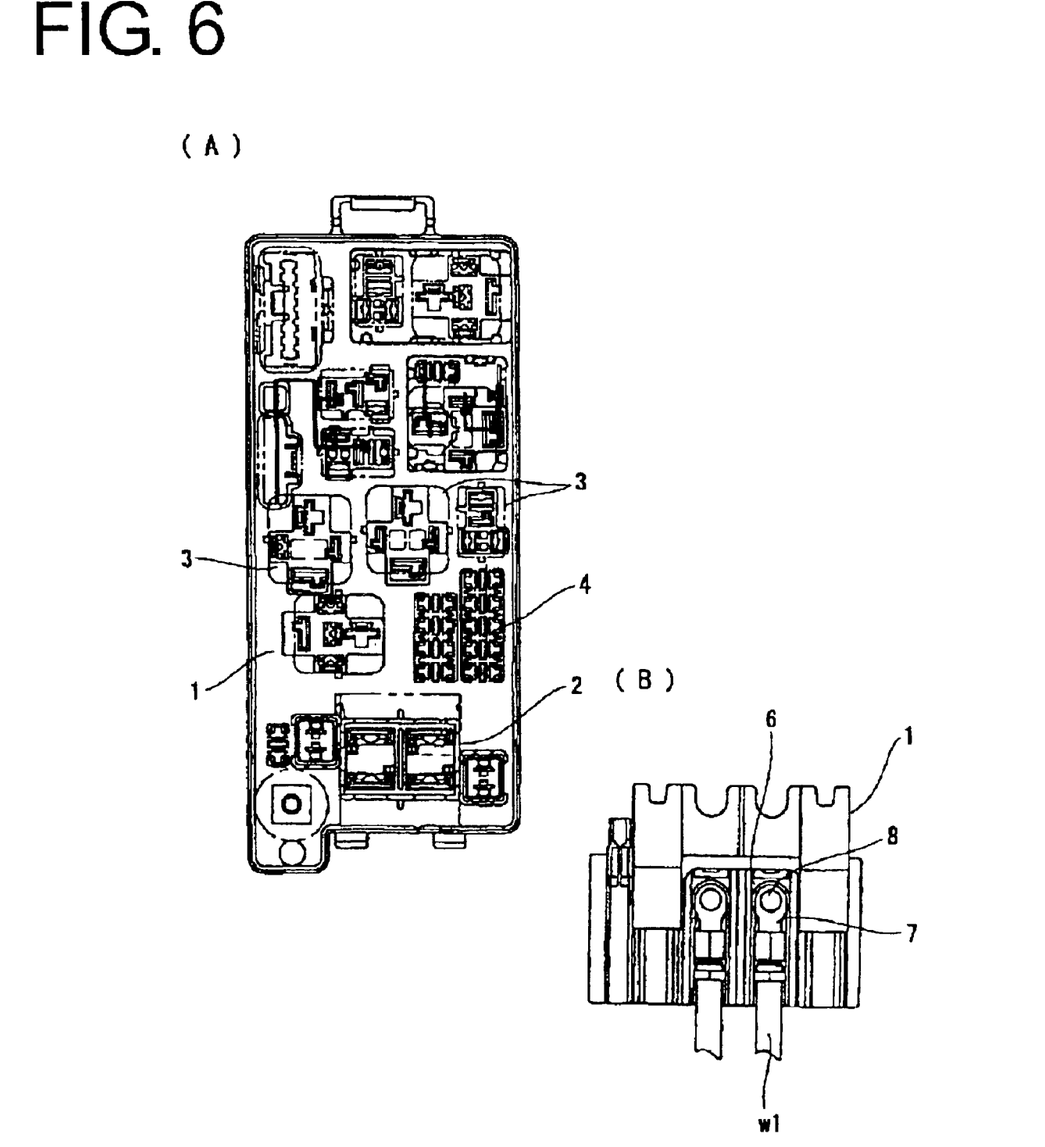
FIGS. 6(A) and 6(B) are a plan view and a side view of a prior art relay block, respectively.

A conventional relay block to be connected with a battery mounted in an automotive vehicle is shown in FIG. 6(A). The relay block has a casing 1 with an upper surface. A fusible link mounting portion 2, a relay mounting portions 3 and a fuse mounting portion 4 are formed in the upper surface of the casing 1, and fusible links (large-current fuses), relays and fuses are connected with and mounted in the respective mounting portions 2 to 4. The fusible links, the relays and the fuses are connected via wires.

Terminals are connected to ends of wires and are locked in a terminal accommodating portion (not shown) at the bottom of the casing 1 for connection with output terminals of the relays and the fuses.

Bolt-fastenable terminals 7 are connected with ends of power-supply wires w1 and are connected electrically with a busbar 6 in the casing 1 by bolts 8, as shown in FIG. 6(B).

There has been a recent increase of electric and electronic devices in automotive vehicles, and a corresponding increase in the number of relays and fuses mounted in a relay block. A relay block that has the construction shown in FIGS. 6(A) and 6(B), has an undesirably large size.

Wires connected with a power supply and an alternator are connected to the busbar by the bolts. Accordingly, a necessary bolt-fastening operation reduces the assembling efficiency of the relay block.

The invention was developed in view of the above problems, and an object thereof is to arrange parts at a high density in a block main body.

SUMMARY OF THE INVENTION

The invention is directed to an electrical connection box with a busbar arranged substantially along a clearance between a plurality of first part mounting portions and/or a second part-mounting portion in a block main body. The busbar comprises tabs for the connection with first electronic or electric parts and/or second electronic or electric parts. The tabs are formed by bending portions of the busbar for disposition in the first part mounting portions and/or the second part-mounting portion.

The busbar may be stamped from a conductive metal plate and is formed unitarily or integrally with at least one narrow fusible link. The fusible link may be set to be fusible at 30 amperes or higher. Accordingly, fusible links mounted as separate parts are reduced or eliminated.

The tabs may be formed by bending the busbar downstream or at a power-output side of the fusible link and may be inserted through terminal holes formed in relay mounting portions and/or the fuse mounting portion.

The busbar utilizes the dead space between the relay mounting portions and the fuse mounting portion. Thus, it is not necessary to provide a special space for the busbar, and the relay block or other the electrical connection box can be smaller. Additionally, the busbar is arranged in dead space that preferably is covered only by an upper casing. Accordingly, heat radiation can be improved.

The large capacity integral or unitary fusible link that is seldom exchanged avoids the need for a separate fusible link. Further, the busbar formed integrally or unitarily with the fusible link, avoids the need for wires to connect the fusible link, relays and fuses, thereby reducing the number of parts and the number of operation steps.

The tabs of the busbar to be connected with the first and/or second parts each are provided with a pair of holding pieces that define an insulation-displacement slot for electrical connection with terminals of the first and second parts mounted into the first and second mounting portions by directly holding the terminals with the holding pieces. Thus, the busbar can be connected directly with the first and/or second parts without using intermediate terminals. Accordingly, space can be saved and the number of parts can be reduced.

The busbar preferably is made of a single plate and is formed by bending at an upstream end with a tab for connection with a power supply. The power supply is connected with the first and/or the second parts via the fusible link. The busbar has a tab for connection with an alternator by bending; and/or the power supply is connected with the tab for connection with the alternator via the fusible link.

The busbar in the electrical connection box, such as a relay block, conventionally has been connected with a power-supply wire and a wire used for the connection with the alternator by crimping bolt-fastenable terminals into connection with the ends of the wires and connecting the wires with the busbars by fastening bolts. However, the tabs of the busbar of the present invention can be connected with the female terminals connected with the ends of the wires. Thus, a bolt fastening operation can be dispensed with, and the number of operation steps can be reduced.

The fuses preferably are exchangeably insertable for connection except a fusible link of a large-capacity fuse.

A connector-accommodating portion also may be provided, and a connector connected with the ends of a group of wires may be fitted into and connected with the tabs of the busbar.

Preferably, the first part mounting portions and/or second part mounting portion project from the inner surface of a surrounding wall of the main body; the clearance between the first part mounting portions and/or the second part mounting portion is an empty space. A lower casing is assembled into a lower part of the block main body. A bottom wall of the lower casing preferably is shaped to be fittable into the empty space of the block main body; and/or the busbar can be secured onto substantially the entire surface of the bottom wall of the lower casing.

The electrical connection box, such as a relay block, can be produced at a lower cost by enabling a high-density of parts and a reduced number of parts and can have an improved quality by shortening the assembly process.

The invention also is directed to a method for producing an electrical connection box. The method comprises providing a busbar and bending portions of the busbar to form tabs for connection with first parts and/or second parts. The method continues by arranging the busbar substantially along a clearance, which is a dead space, between a plurality of first part mounting portions and/or a second part mounting portion in a block main body, and at least partly arranging the tabs in the first part mounting portions and/or the second part mounting portion.

The busbar may be formed to integrally or unitarily comprise at least one narrow fusible link, preferably formed by stamping out a conductive metal plate. The fusible link preferably is set to be fusible at 30 amperes or higher.

Preferably, the step of forming the tabs comprises bending portions of the busbar at positions downstream of the fusible link portion.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

A relay block according to the invention is identified by the numeral 10 in FIGS. 1 to 5, and is configured for connection with a power-supply wire or conductor. The relay block 10 includes a main body 11, a lower casing 12 and a busbar 13, as shown in the exploded perspective view of FIG. 1.

Figure 1:
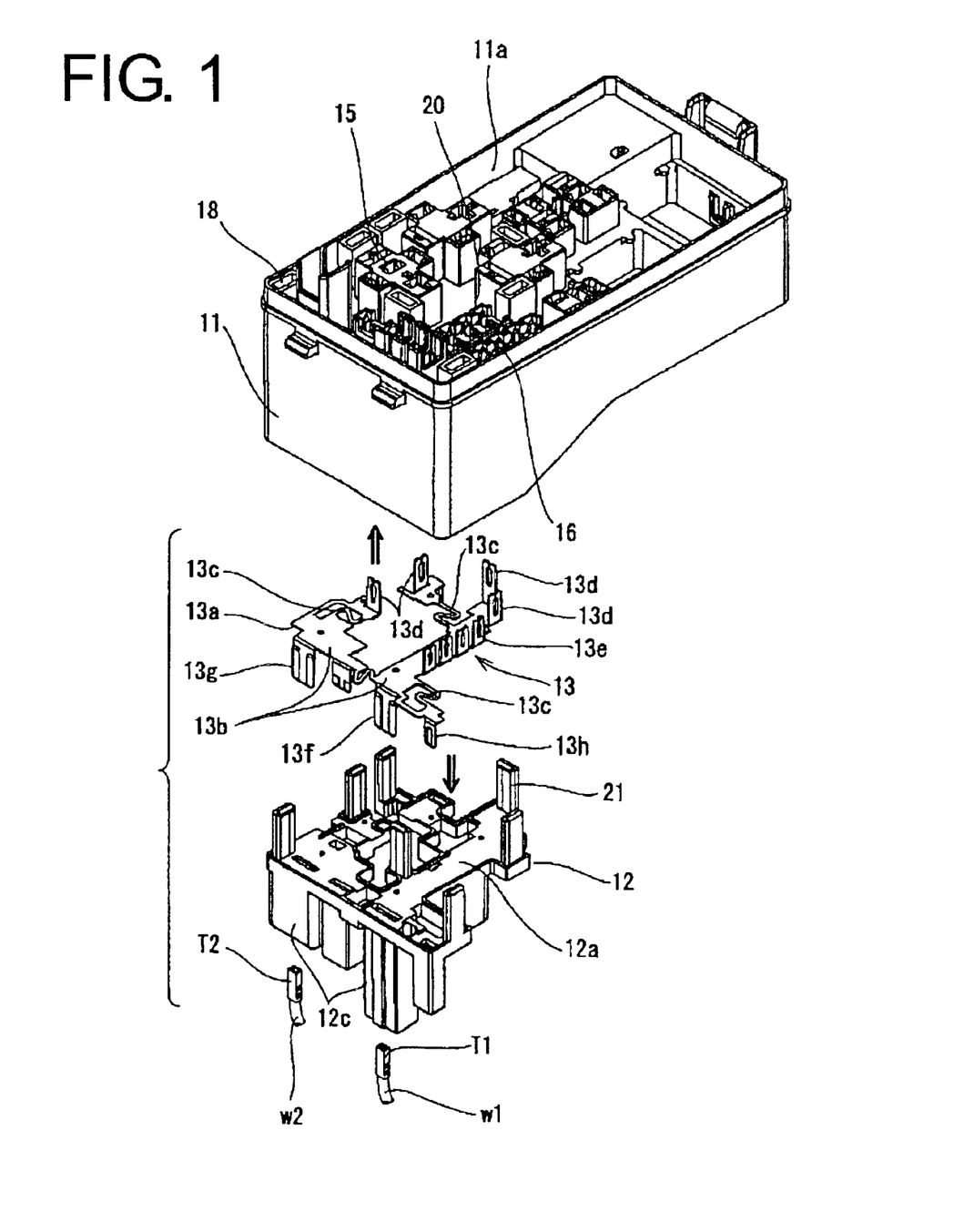
FIG. 1 is an exploded perspective view of a relay block according to one embodiment of the present invention.

The main body 11 has a rectangular surrounding wall 11a with an inner surface. Relay mounting portions 15 and a fuse mounting portion 16 project from the inner surface of the rectangular surrounding wall 11a, and are disposed such that a clearance 20 exists between the relay mounting portions 15 and the fuse mounting portion 16. Tubes 18 are formed along the inner surface of the surrounding wall 11a and are dimensioned to receive protection walls 21 projecting from the lower casing 12.

Figure 3:
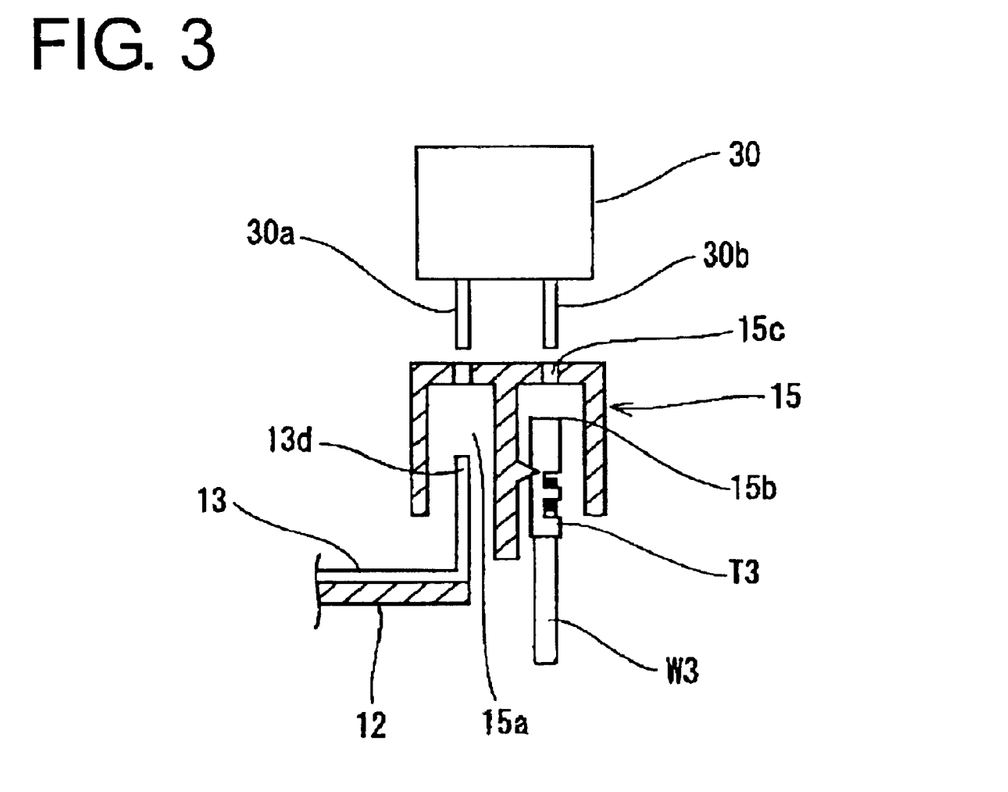
FIG. 3 is a schematic section showing how a relay and the busbar are connected.

Each relay mounting portion 15 has a tab inserting portion 15a, a terminal inserting portion 15b and terminal holes 15c that communicate with the tab inserting portion 15a and the terminal inserting portion 15b. The tab inserting portion 15a is configured to receive a tab 13d of the busbar 13, while the terminal inserting portion 15b is configured to receive and lock a female terminal T3 at an end of a wire w. A relay 30 has input and output terminals 30a and 30b that can be inserted into the terminal holes 15c. Thus, the input terminal 30a can be connected with the tab 13d of the busbar 13, and the output terminal 30b can be connected with the female terminal T3.

The fuse mounting portion 16 is similar to the relay mounting portions 15. A fuse can be plugged in and mounted, and an input terminal of the fuse can be connected with a tab 13e of the busbar 13 while an output terminal of the fuse can be connected with a terminal at an end of a wire.

A bottom wall 12a of the lower casing 12 is shaped to fit into the clearance 20 of the main body 11. The busbar 13 is formed by stamping an electrically conductive metallic material into the shape shown in FIG. 4 and the stamped out sheet is bent, folded and/or embossed into the shape shown in FIGS. 1 and 2 (shown by hatching). A substantially flat portion 13a of the busbar 13 substantially conforms to the shape of the bottom wall 12a, and is secured to the upper surface of the bottom wall 12a by crimping. The flat portion 13a is arranged along or around the clearance 20, which is a dead space between the relay mounting portions 15 and the fuse mounting portion 16 when the busbar 13 is mounted into the main body 11.

Figure 4:
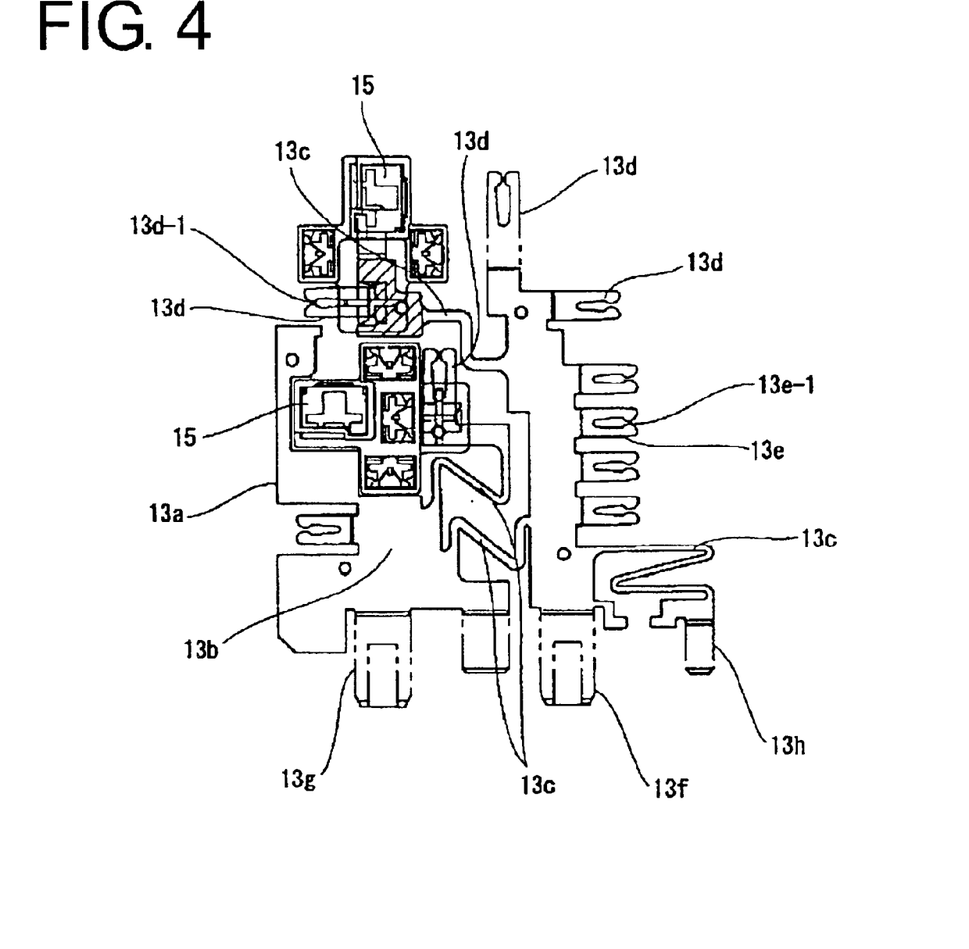
FIG. 4 is a development of the busbar.
Figure 5:
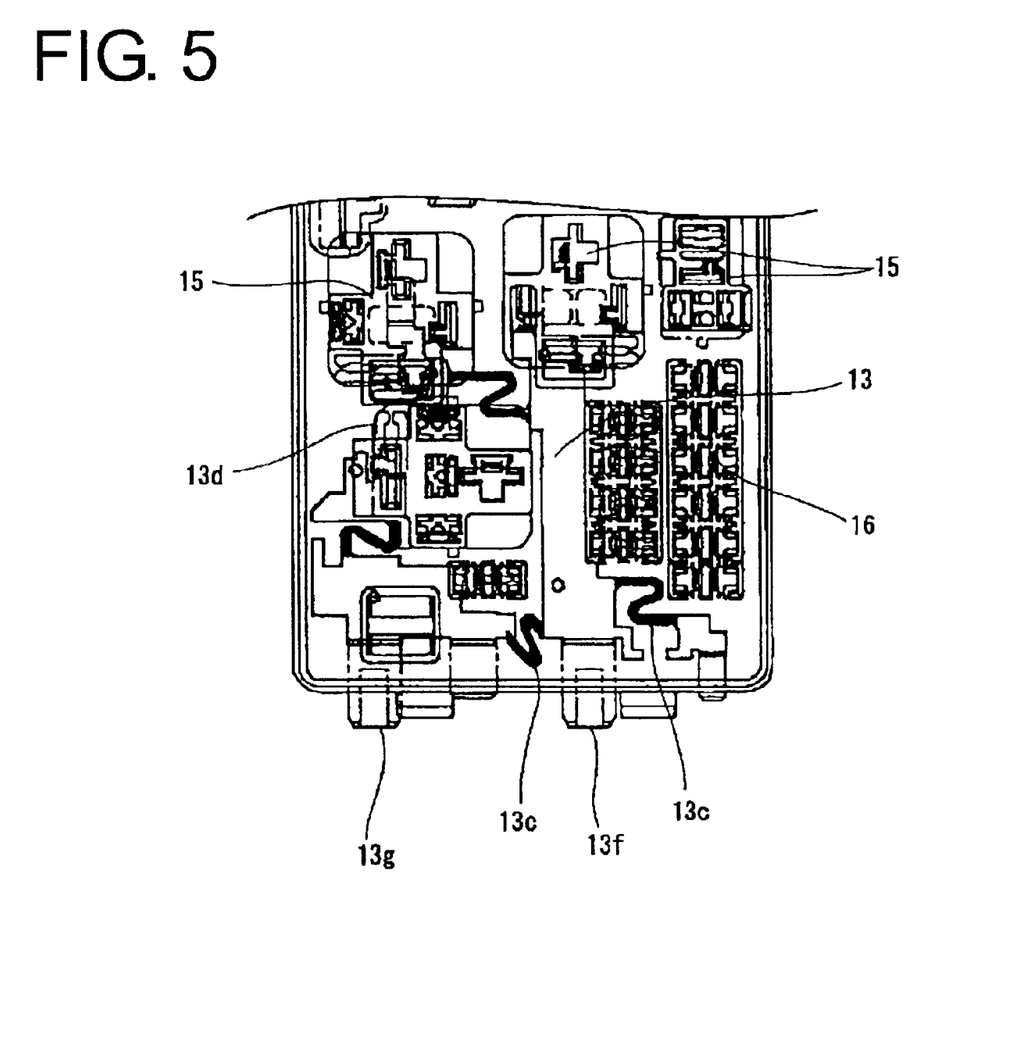
FIG. 5 is a partial plan view of the relay block.

The flat portion 13a is formed with narrow S- or zig-zag-shaped fusible links 13c, which extend from wide portions 13b that are placed on substantially the entire surface of the clearance 20. The fusible links 13c are fusible at a current of more than 30 A, most preferably between 140 and 30 amperes.

The tabs 13d for connection with the relay 30 are formed at ends of the flat portion 13a and are bent up. The tabs 13e for connection with the fuses are substantially side-by-side and are bent at one side of the busbar 13. Further, a tab 13f for connection with the power-supply wire and a tab 13g for connection with a wire extending to an alternator are formed at one side edge of the flat portion 13a and are bent down at an angle. A tab 13h is at one side edge for connection with a terminal at an end of a wire connected with a fuser.

The tabs 13d, 13e have slots 13d-1, 13e-1 at their projecting ends for direct connection with input terminals of the relays and the fuses to be mounted into the relay mounting portions 15 and the fuse mounting portion 16.

Figure 2:
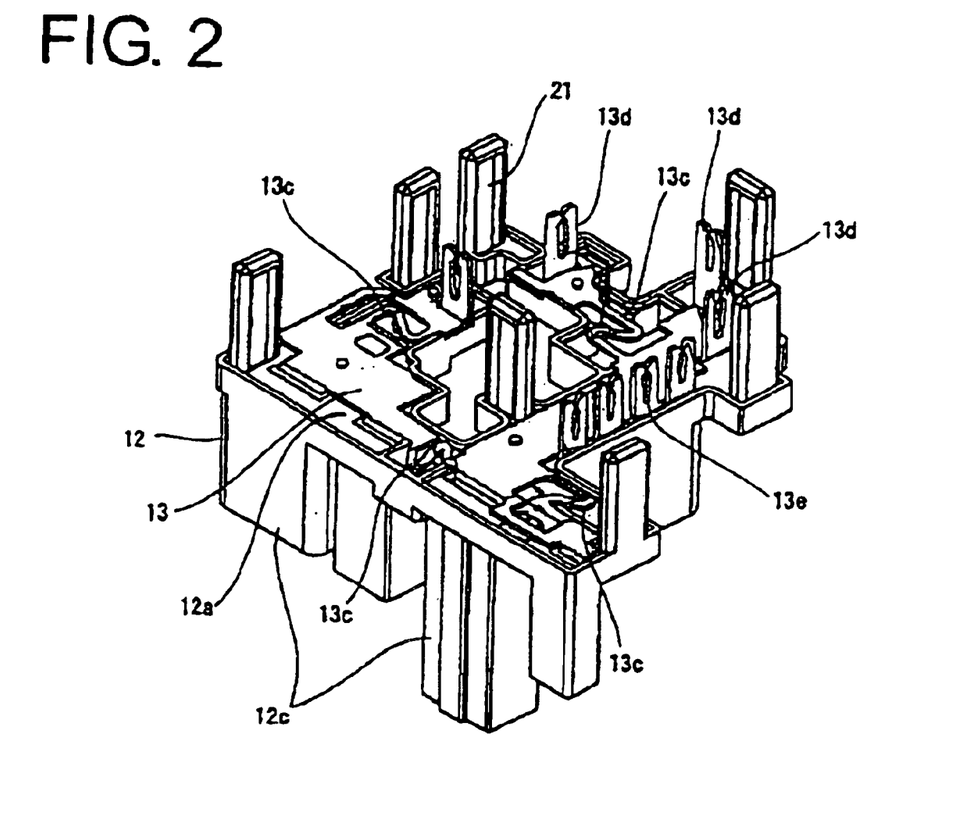
FIG. 2 is a perspective view showing a state where a busbar is secured to a lower casing.

The tab 13f for connection with the power-supply wire and the tab 13g for connection with the alternator project into terminal accommodating portions of wire connecting portions 12c on the bottom wall 12a of the lower casing 12. Thus, the tab 13f is connectable with a female terminal T1 at the end of a power-supply wire w1 and the tab 13g is connected with the female terminal T2 at the end of a wire w2 extending to the alternator. It should be noted that the tabs 13f, 13g may be connected with the terminals at the ends of the wires via connectors.

The lower casing 12 is assembled into the lower part of the main body 11 with the busbar 13 secured on the bottom wall 12a thereof by crimping, bending or folding. The lower casing 12 is locked into the main body 11 with the protection walls 21 inserted and held in the tubes 18. Thus, the relay block 10 has a construction shown in FIG. 6.

The busbar 13 is arranged along the clearance 20, which is a dead space, between the relay mounting portions 15 and the fuse mounting portion 16 in the main body 11. Thus, the tabs 13d for the relays formed by bending the busbar 13 are inserted into terminal accommodating portions of the relay mounting portions 15 and the tabs 13e for the fuses are inserted into a terminal accommodating portion of the fuse mounting portion 16.

The relays and the fuses are mounted into the relay mounting portions 15 and the fuse mounting portion 16 and the terminals thereof are inserted through the terminal holes in the upper surfaces of the mounting portions 15, 16. Thus, the input terminals connect directly with the tabs 13d, 13e of the busbars 13.

The output terminals of the relays and the fuses connect with the terminals at the ends of the wires inserted into and locked in the wire connecting portions at the bottoms of the relay mounting portions 15 and the fuse mounting portion 16.

After the relays and the fuses are mounted, an upper or second casing (not shown) is mounted on the upper surface of the main body 11.

The busbar 13 connects the power supply, the fusible links, the fuses and the relays and is arranged along the clearance 20 between the relay mounting portions 15 and the fuse mounting portion 16 in the relay block. Thus, it is not necessary to provide a special space for the busbar, and the busbar 13 can be smaller. Further, the busbar 13 can be arranged in the clearance 20 by being secured to the bottom wall 12a of the lower casing 12 and the open space thereabove is to be covered by the upper casing. Thus, heat radiation can be improved. Furthermore, the busbar 13 is formed with the fusible links 13c. Hence, fusible link mounting portions can be dispensed with and, accordingly, the relay block can be made smaller, the number of parts can be reduced and assembling operability can be improved as compared to a case where fusible links are mounted as separate parts.

Although the invention is applied to a relay block in this embodiment, it may be applied to other electrical connection boxes.

The busbar utilizes the dead space between the mounted parts in the electrical connection box, even if the number of relays, fuses and other electric/electronic parts (such as transistors, diodes, capacitors, transformers, jumpers, inductances, control units, processors, etc.) to be mounted in the electrical connection box is increased. Thus, the electrical connection box is small, and has a high-density arrangement of parts.

The busbar is formed with the narrow fusible links. Thus, separate fusible links can be reduced or eliminated. The tabs of the busbars to be connected with the relays and the fuses are formed with an insulation-displacement or connection slot for direct connection with the terminals of the relays and the fuses without using intermediate terminals. Thus, the number of the parts can be reduced.

Further, the connection of the busbar with the power-supply wire and the wire connected with the alternator is made by fittably connecting the tabs and the female terminals instead of conventional fastening by bolts, a bolt-fastening operation can be dispensed with, thereby reducing the number of operation steps. As a result, quality can be improved.

What is claimed is:

1. An electrical connection box, comprising:
   a main body having a top wall, a plurality of part-mounting portions extending up from the top wall and configured for receiving circuit parts, a clearance defining an empty space between the part-mounting portions, the main body further having a lower part extending down from the top wall;
   a lower casing being assembled to the lower part of the main body, the lower casing having a substantially planar bottom wall shaped to fit into alignment with the empty space of the main body, a power wire connecting portion extending down from the bottom wall of the lower casing at locations offset from the part-mounting portions of the main body; and
   a busbar having a substantially planar base secured onto substantially all of the substantially planar bottom wall of the lower casing and disposed between the bottom wall of the lower casing and the top wall of the main body, the base of the busbar being arranged substantially along the clearance, circuit part tabs bent unitarily up from at least a first part of the substantially planar base and arranged in the part-mounting portions of the main body, the circuit part tabs being configured for connection with the circuit parts received in the part-mounting portions, a power tab bent unitarily down from a second part of the planar base and extending into the power wire connecting portion of the lower casing for connection with a power wire, the power tab being configured for slidable connection with a power wire terminal, and the substantially planar base of the busbar being formed unitarily with a plurality of substantially planar fusible links and lying in a plane defined by the substantially planar base, and disposed between the first and second parts of the planar base.

2. The electrical connection box of claim 1, wherein the fusible link is narrower than portions of the substantially planar base on either side of the fusible link.

3. The electrical connection box of claim 1, wherein:
   a plurality of the tabs of the busbar each have a leading end with a pair of holding pieces defining a connection slot configured for electrical connection with terminals of the circuit parts by directly holding the terminals by the holding pieces.

4. The electrical connection box of claim 1, the lower casing further comprising an alternator wire connecting portion extending down from the bottom wall of the lower casing at a location offset from the part-mounting portions of the main body, the busbar having an alternator tab bent unitarily down from a third part of the planar base and extending into the alternator wire connecting portion of the lower casing, the alternator tab being configured for connection with an alternator, one of said fusible links being disposed between the second and third parts of the planar base for separating the power tab from the alternator tab.

5. The electrical connection box of claim 1, wherein the part-mounting portions project from an inner surface of a surrounding wall of the main body.

6. An electrical connection box, comprising:
   a main body having a substantially planar base wall with top and bottom surfaces, spaced-apart part-mounting portions projecting up from the top surface of the base wall for receiving relays and fuses, and a clearance defining a dead space extending along the base wall between the part-mounting portions;

a lower casing assembled onto the bottom surface of the base wall of the main body, the lower casing having a substantially planar bottom wall substantially parallel to the base wall of the main body, a power wire connecting portion extending down from the bottom wall of the lower casing at a location offset from the part-mounting portions of the main body; and a unitarily formed busbar having a flat portion disposed between the bottom surface of the substantially planar base wall of the main body and the bottom wall of the lower casing, the flat portion of the busbar being secured to substantially all of the bottom wall of the lower casing and being arranged substantially along the clearance between the part-mounting portions, the flat portion including a power supply section, a power distribution section and at least one fusible link extending therebetween, the fusible link having a capacity of at least 30 amps and lying in a plane substantially parallel and adjacent the substantially planar base wall, such that the fusible link and the flat portion of the busbar are substantially coplanar, at least one power supply tab bent down from the power supply section of the flat portion and extending into the power wire connecting portion of the lower casing and a plurality of relay and fuse tabs bent up from the power distribution section of the flat portion and projecting into the part mounting portions for connection with the relays and fuses.

7. The electrical connection box of claim 6, wherein the at least one fusible link comprises a plurality of fusible links, each of said fusible links being substantially coplanar with the flat portion of the busbar.

8. The electrical connection box of claim 7, wherein the relay and fuse tabs are bent substantially normal to the flat portion of the busbar.

9. The electrical connection box of claim 8, wherein the power supply tab is bent substantially normal to the flat portion of the busbar.

10. The electrical connection box of claim 6, wherein the lower casing includes a plurality of wire connecting portions extending from the base wall in directions away from the busbar and the main body.

11. The electrical connection box of claim 6, wherein the electrical connection box is substantially free of wires at locations between the main body and the lower casing.

12. The electrical connection box of claim 6, wherein the lower casing further includes an alternator wire connecting portion extending down from the bottom wall of the lower casing at a location offset from the part mounting portions of the main body, at least a second fusible link extending between the power supply section and the alternator section, an alternator tab bent down from the alternator section and projecting into the alternator wire connecting portion of the lower casing.

* * * * *